United States Patent [19]
O'Sullivan

[11] Patent Number: 5,986,485
[45] Date of Patent: Nov. 16, 1999

[54] AUTO-LOCK CIRCUIT GUARANTEEING LOW JITTER IN PHASE-LOCKED LOOP FREQUENCY SYNTHESIZERS IRRESPECTIVE OF PROCESS VARIATIONS

[75] Inventor: Eugene O'Sullivan, Tokyo, Japan

[73] Assignee: NEC Corporation, Tokyo, Japan

[21] Appl. No.: 08/917,483

[22] Filed: Aug. 26, 1997

[30] Foreign Application Priority Data

Aug. 26, 1996 [JP] Japan ................................. 8-223638

[51] Int. Cl.$^6$ ............................. H03L 7/095; H03L 7/10
[52] U.S. Cl. ......................... 327/156; 327/159; 331/176; 331/17
[58] Field of Search ................................ 327/147, 148, 327/150, 151, 156, 157, 159, 160; 331/11, 17, 25, 57, 176

[56] References Cited

U.S. PATENT DOCUMENTS 5,375,148  12/1994  Parker et al. ............................. 331/17
5,757,238  5/1998  Ferraiolo et al. ....................... 327/156

Primary Examiner—Timothy P. Callahan
Assistant Examiner—Eunja Shin
Attorney, Agent, or Firm—Sughrue, Mion, Zinn, Macpeak & Seas, PLLC

[57] ABSTRACT

By using a bias switch (260) to define a unique current range in a bias generator (142) for each n-bit counter output state, it is possible to control a VCO (140) which has a very wide operating frequency range. These frequency ranges must overlap to guarantee the lock irrespective of process or environmental (temperature and voltage) variations. Depending on an input value of an overall lock signal OLS to an n-bit counter (250) at the rising edge of its clock signal CLK, it is possible to scan the full spectrum of VCO frequency ranges until the lock is achieved. By comparing a switch voltage to a reference voltage Vref, it is possible to prevent the PLL from locking at the very right-hand edge of a frequency range unless it can maintain that the lock over the entire operating temperature range. By strobing a fine lock signal FLS at an integer m (>1) number of points, it is possible to prevent false lock from occurring.

7 Claims, 7 Drawing Sheets

AUTO-LOCK CIRCUIT GUARANTEEING LOW JITTER IN PHASE-LOCKED LOOP FREQUENCY SYNTHESIZERS IRRESPECTIVE OF PROCESS VARIATIONS

BACKGROUND OF THE INVENTION

This invention relates to all BICMOS voltage controlled oscillators used in frequency synthesis phase-locked loop applications.

A voltage controlled oscillator (VCO) is a device whose output frequency (Fout) is a function of its input control voltage (Vcnt). The VCO is often used to track a reference frequency (Fref) of a reference frequency signal by the use a phase-locked loop (PLL). A phase detector detects a phase difference between the phase of the reference frequency signal and the phase of a divided frequency Fvco/N (N=1, 2, 3, 4, . . . ) of the VCO. Depending on this phase difference, an input node of the VCO is either charged or discharged, thereby altering the VCO's frequency of oscillation. When the frequencies of the two input signals of the phase detector are the same within a given error margin, the PLL is then called to be "locked" to the reference frequency signal. VCO design is critical in determining the overall performance of the PLL. The VCO's stability to small fluctuations in its input voltage is very important in determining PLL stability and jitter. The jitter can be thought of as spurious variations in the time positions of a series of successive pulses.

As will later be described in detail, in order to realize low jitter irrespective of process variations, the VCO which has multiple current ranges and which can choose the optimum current range for each process chip, is required. Manual current switching is troublesome for the customer and increases pin count while laser trimming is extremely expensive. Thus, an automatic device of providing each type of process chip with its optimum current range is important. It is also important that the lock can be maintained over a very wide operating temperature range.

SUMMARY OF THE INVENTION

It is an object of the present invention to provide an auto-lock circuit which ensures that a PLL automatically locks a the target frequency displays very low jitter irrespective of process variations and which maintains this lock over a very wide operating temperature range.

According to this invention, there is provided an auto-lock circuit which guarantees that a phase-locked loop (PLL) circuit locks with very low jitter irrespective of process variations and maintains the lock over a very wide operating temperature range, the auto-lock circuit comprising a voltage generator which produces a reference voltage having an almost zero temperature coefficient related to the voltage; a voltage comparator which compares the output voltage of one of two switches to a reference voltage, the two switches being for selecting one of an input d.c. voltage and a ground voltage; a selector circuit which selects a high frequency signal output used to determine a threshold phase value by the use of the output of a voltage controlled oscillator (VCO) and the output of internal nodes within a programmable frequency divider, the high frequency signal being selected depending on a division ratio of the programmable frequency divider; a lock detector which detects a phase difference between a reference frequency signal and a divided output frequency signal of the VCO, when the phase difference is less than the threshold phase value, the output of the lock detector indicating that the PLL is locked, when the phase difference is greater than the threshold phase value, the output of the lock detector indicating that the PLL is unlocked; a timer circuit which produces a single output clock signal or multiple output clock signals defining strobe points in response to the reference frequency signal, one of these output clock signals having a cycle time longer than a required lock-up time of the PLL; a strobe circuit which strobes the output of the lock detector by using the output clock signals from the timer circuit and the reference frequency signal, the output of the strobe circuit indicating whether or not lock can be achieved in the present frequency range at the present ambient temperature; an AND gate which carries out a logical AND operation of the output of the voltage comparator and the output of the strobe circuit, the output value of the AND gate indicating whether or not the PLL achieves the lock and whether or not it maintains the lock over the entire operating temperature range under "normal PLL operation"; a level translator which translates the output level of the AND gate to a level for controlling which of the two switches is ON at any one time; an n-bit counter which is supplied with the output of the AND gate as an input control signal and which can have up to $2^n$ unique output states, each unique state defining a unique current range in a bias generator included in the VCO and hence defining a unique frequency range in the VCO, the value of each unique state being controlled by the value of the input control signal, the input control signal denoting whether or not the PLL maintains the "locked" state over the entire operating temperature range, a clock signal of the n-bit counter coming from one of the outputs of the strobe circuit; and a bias switch which controls the current following in the bias generator of the VCO in response to the output of the n-bit counter, the order in which the switches in the bias generator are activated being important.

DESCRIPTION OF THE PREFERRED EMBODIMENTS

Figure 1:
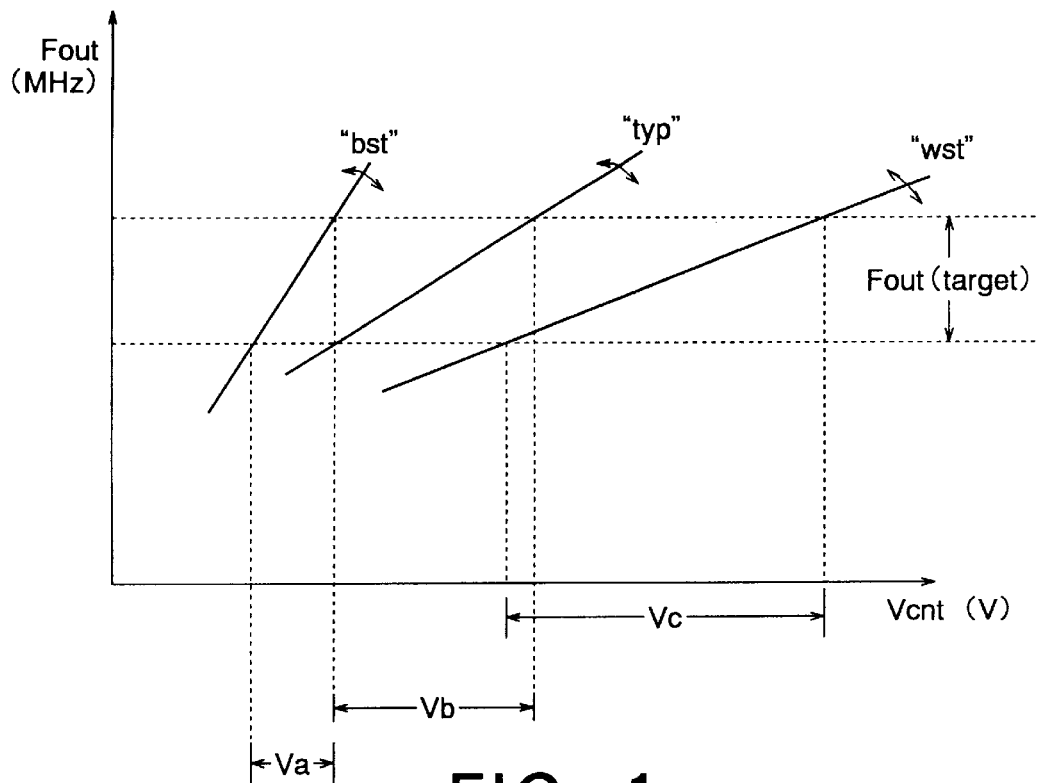
FIG. 1 shows a frequency characteristic of a conventional VCO.
Figure 2:
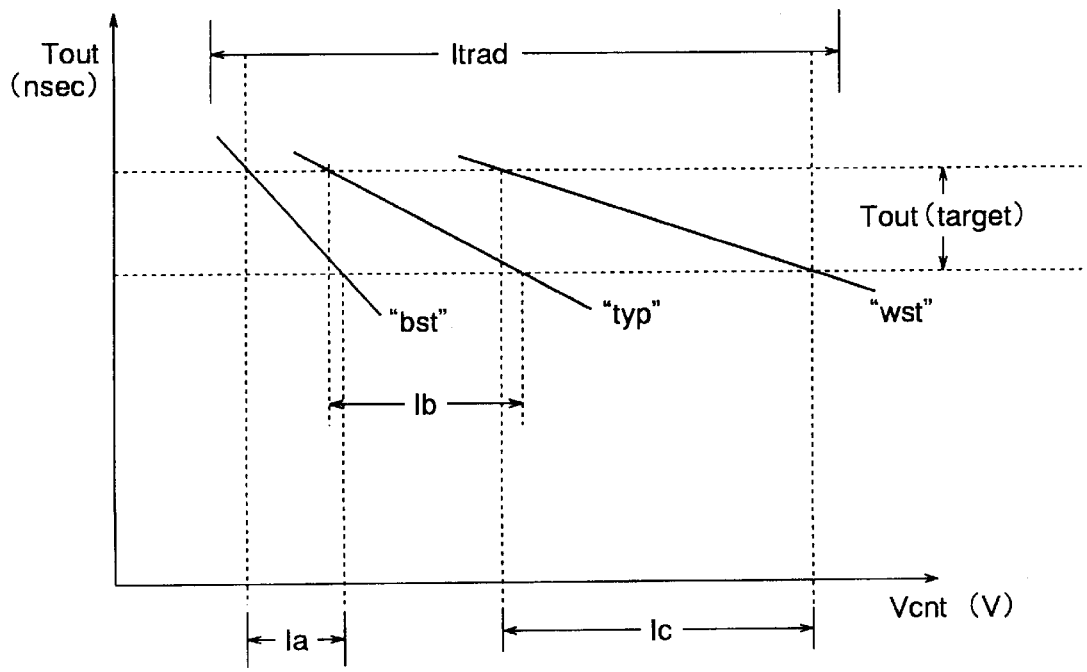
FIG. 2 shows a current characteristic of the conventional VCO.

Referring to FIGS. 1 and 2, description will be made as regards to the typical characteristic of a VCO in a PLL circuit in order to facilitate an understanding of the present invention.

For brevity of description, the VCO characteristic shown in FIG. 1 assumes that as a DC input voltage increases, an output frequency also increases. Of course, the reverse characteristic also exists. While temperature and power-supply variations will cause an oscillation frequency to change (indicates by <-> in FIG. 1, the far biggest influence on where the characteristic ultimately lies and its slope is the actual process condition ("bst", "typ" and "wst") at the time of manufacture. The "bst" represents the process condition (resistor value, transistors parameter values, wire capacitance value) which results in highest output speed. The "typ" represents those values which results in average output speed while the "wst" represents those values which result in lowest speed. In FIG. 1, typical temperature and power-supply conditions are assumed.

The input voltage ranges (Va, Vb, Vc) each of which produces the actual required target frequency output range depends heavily on the process condition. Consequently, required current ranges (Ia, Ib and Ic shown in FIG. 2) flowing in a bias generator change drastically from one process condition to another. The required current range (Ic) is widest in the worst process condition and narrowest (Ia) in the best process condition.

Traditionally, irrespective of the process condition, a fixed current range (Itrad) has been used to produce the required frequency Fout. Hence, the same current range is supplied to the VCO in the worst case where a large current range (Ic) is required to produce the target output time Tout(target), as it is in the best case where in contrast only a small current range (Ia) is needed. It will now be illustrated with an example that, using this traditional approach, small fluctuations in input current can produce significant shifts in Tout(target) and hence, increase jitter and degrade system stability.

For example, it is assumed that:
(a) Itrad=250 μA, Ia=20 μA, Ib=40 μA, and Ic=90 μA,
(b) the VCO operates over a 120 MHz frequency range by carrying the input voltage from 0.8 to 3.3 volts, and
(c) a 50 mV fluctuation in input voltage produces a (Itrad/50) variation in input current.

This 5 μA change in the input current will produce a 30 MHz, 15 MHz, and 6.67 MHz change in oscillation frequency for a best, typical, and worst case process condition, respectively. In fact, the steeper the slope of the Tout-I characteristic, the bigger the frequency shift. Consequently, system stability is degraded and jitter increases.

In contrast, by dividing Itrad into multiple current ranges, the system stability and the jitter can be significantly improved. For example, for the following three current ranges Ir1=40 μA, Ir2=80 μA and Ir3=160 μA, the same 50 mV input voltage fluctuation will only produce a (40/50)μA, (80/50)μA and (160/50)μA change in the input current and hence 4.8 MHz, 4.8 MHz, 4.26 MHz frequency shift for a best, typical, and worst case process condition, respectively. The larger the number of current ranges, the smaller the frequency shift and hence the smaller the jitter. The current ranges must obviously overlap to ensure that the PLL can achieve the lock irrespective of the process condition, ambient temperature or power-supply voltage.

Thus, in order to obtain low jitter irrespective of process variations, the VCO which has multiple current ranges and which can choose the optimum current range for each process chip, is required. Manual current switching is troublesome for the customer and increases pin count while laser trimming is extremely expensive. Thus, an automatic device of providing each type of process chip with its optimum current range is important. It is also important that the lock can be maintained over a very wide operating temperature range.

Next, the description will be made with regard to the principle of the present invention. A lock detector, as the name suggests, detects a lock state of the PLL by comparing the phase difference between the frequencies Fref and Fvco/N to a threshold value. The latter is defined by a high frequency signal (HFS). If the phase difference between these two frequencies is greater than this threshold value, the lock detector outputs FLS="0". Otherwise, it outputs FLS="1". As the output of the lock detector is a high resolution signal, it is referred to as the fine lock signal (FLS). A timer subcircuit generates output clock signals which define strobe points in a strobe subcircuit. One of these clock signals has a cycle period which is longer than a required lock-up time of the PLL(tlck). This same signal activates the strobe subcircuit. Once activated, the strobe subcircuit strobes signal FLS at an integer m(>1) number of points in time. If the value of FLS is "1" at all these strobe points, the output of the strobe circuit (CLS) is also "1". CLS="1" indicates that the PLL has reached the "locked" state at a temperature T. If FLS="0" at any one of these m strobe points, the PLL is considered to be still in the "unlocked" state, namely CLS="0". While CLS="1" indicates that the PLL has reached the "locked" state at the temperature T, whether the PLL can maintain this state or not over the entire operating temperature range depends on a voltage comparators output VCOUT. A voltage comparator compares either of two voltage signals (VCNT or GND) to a reference voltage Vref. The latter has an almost zero temperature coefficient. While the PLL is in the "unlocked" state, the voltage comparator compares the VCO's input voltage VCNT to Vref. If at that given temperature VCNT<Vref, VCOUT="1". Otherwise, VCOUT "0". If CLS="1" and VCOUT="1", the overall lock signal (OLS) is "1". OLS="1" indicates that the PLL is in the "locked" state and can maintain this state no matter what the temperature. Otherwise OLS="0". Once OLS="1", the voltage comparator compares Vref to GND. In fact, any voltage which is lower than Vref is ok. The value of signal OLS controls the output state of an n-bit counter. OLS="0" commands the counter to change to its next output state while OLS="1" result tells the counter not to change its output state. Each counter state defines a unique current range in the bias generator and hence a unique frequency range in the current controlled oscillator.

A greater understanding of the present invention can be gained from a study of the following section.

By using a bias switch to define a unique current range in the bias generator for each n-bit counter output state, it is possible to produce a VCO which has a very wide operating frequency range. Needless to say, these frequency ranges must overlap to guarantee the lock irrespective of process or environmental (temperature and voltage) variations. Depending on the input value of the overall lock signal (OLS) to the n-bit counter at the rising edge of its clock signal CLK, it is possible to scan the full spectrum of VCO frequency ranges until the lock is achieved. By comparing a switch voltage (Vsw) to a reference voltage (Vref), it is possible to prevent the PLL from locking at the very right-hand edge of a frequency range unless it can maintain that the lock over the entire operating temperature range. By strobing the fine lock signal (FLS) at an integer m (>1) number of points, it is possible to prevent false of the lock from occurring.

Figure 3:
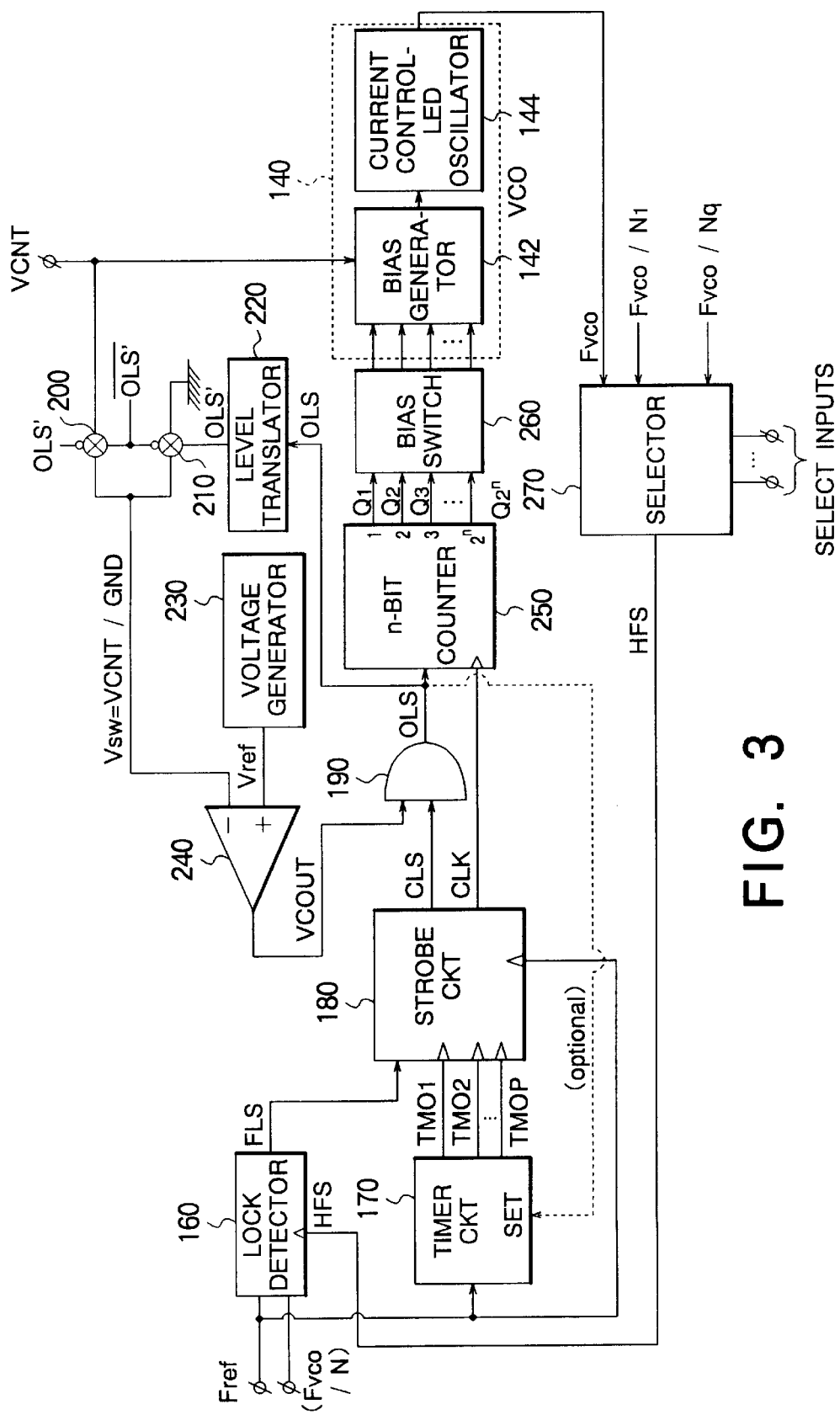
FIG. 3 shows a block diagram of an auto-lock circuit according to a preferred embodiment of the present invention.
Figure 4:
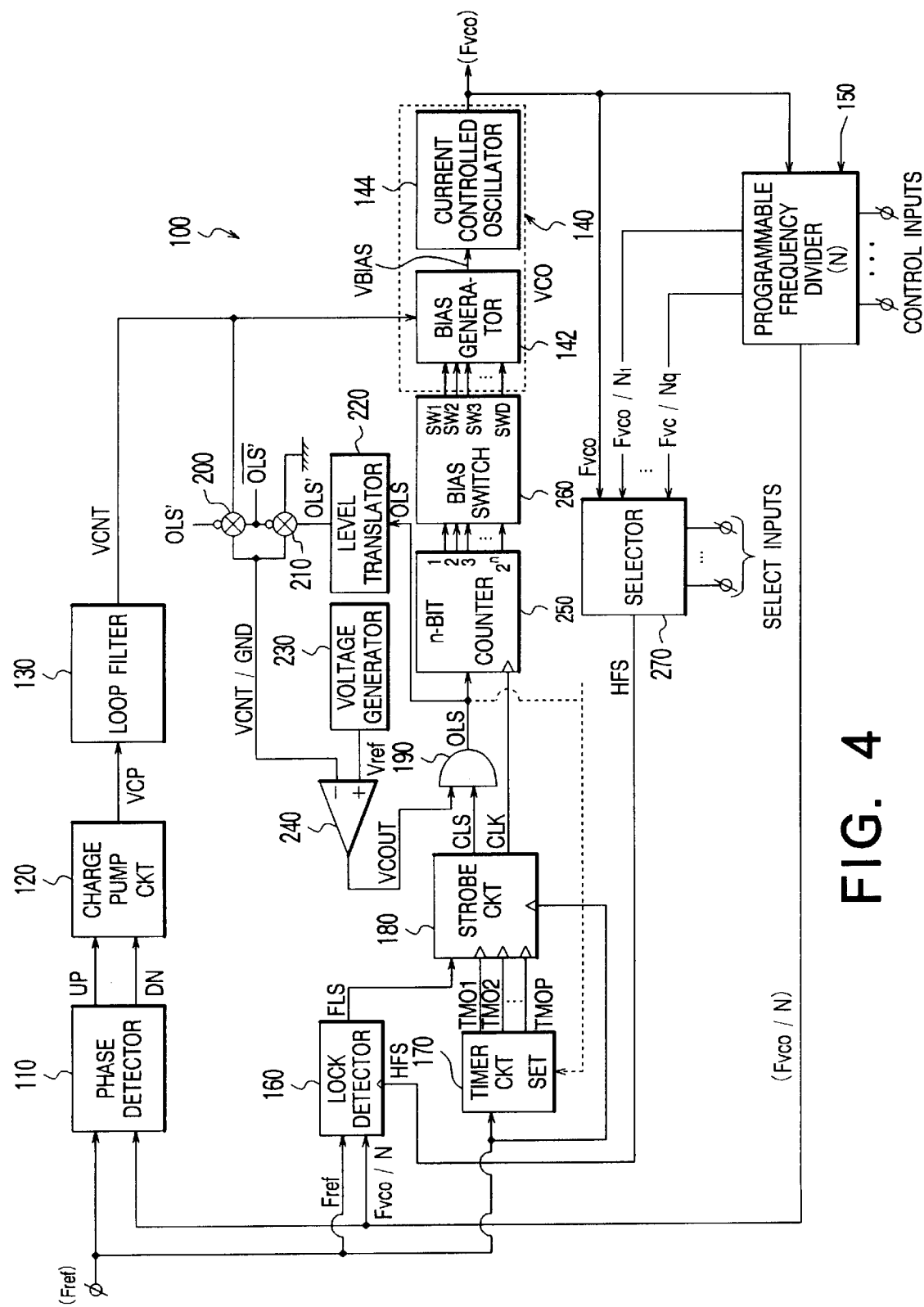
FIG. 4 shows a block diagram of the auto-lock circuit illustrated in FIG. 3 incorporated in a phase-locked loop circuit.

Referring to FIGS. 3 and 4, the description will proceed to an auto-lock circuit according to a preferred embodiment of the present invention.

FIG. 3 shows the present invention incorporated in a phase-locked loop circuit 100. A phase detector 110 responds to differences in phase between the frequencies Fref and Fvco/N to produce two output signals UP and DN.

When the frequency Fref of the reference frequency signal is greater than the VCO's divided frequency Fvco/N, only the signal UP is high. When the frequency Fref is less than the VCO's divided frequency Fvco/N, only the signal DN is high. A charge pump circuit 120 generates a difference signal VCP in response to the signals UP and DN. A loop filter 130 filters the voltage of the difference signal VCP and generates a signal VCNT which is used to control an oscillation frequency of a VCO 140. The latter contains a bias generator 142 and a current controlled oscillator 144. A programmable frequency divider 150 divides the frequency Fvco of an output frequency signal of the VCO 140 by an integer value N to produce an output frequency signal having the divided frequency Fvco/N. The integer value N is set control inputs supplied to the programmable frequency dividers 150. The VCO 140 is called to be in a synchronous state or a "locked" state when the frequency Fref of the input signal and the divided frequency Fvco/N are matched within an error margin. In comparison, the VCO 140 is called to be in an unsynchro-nous state or an "unlocked" state when the frequencies Fref and Fvco/N are unmatched. The time taken for the PLL 100 to achieve the locked state is called a lock-up time tlck. All the above-mentioned blocks are general blocks that are found in most phase-locked loop circuits. "Normal PLL operation" involves only these blocks. All the remaining blocks shown in FIG. 3 constitute the present invention i.e. the auto-lock circuit.

Figure 5:
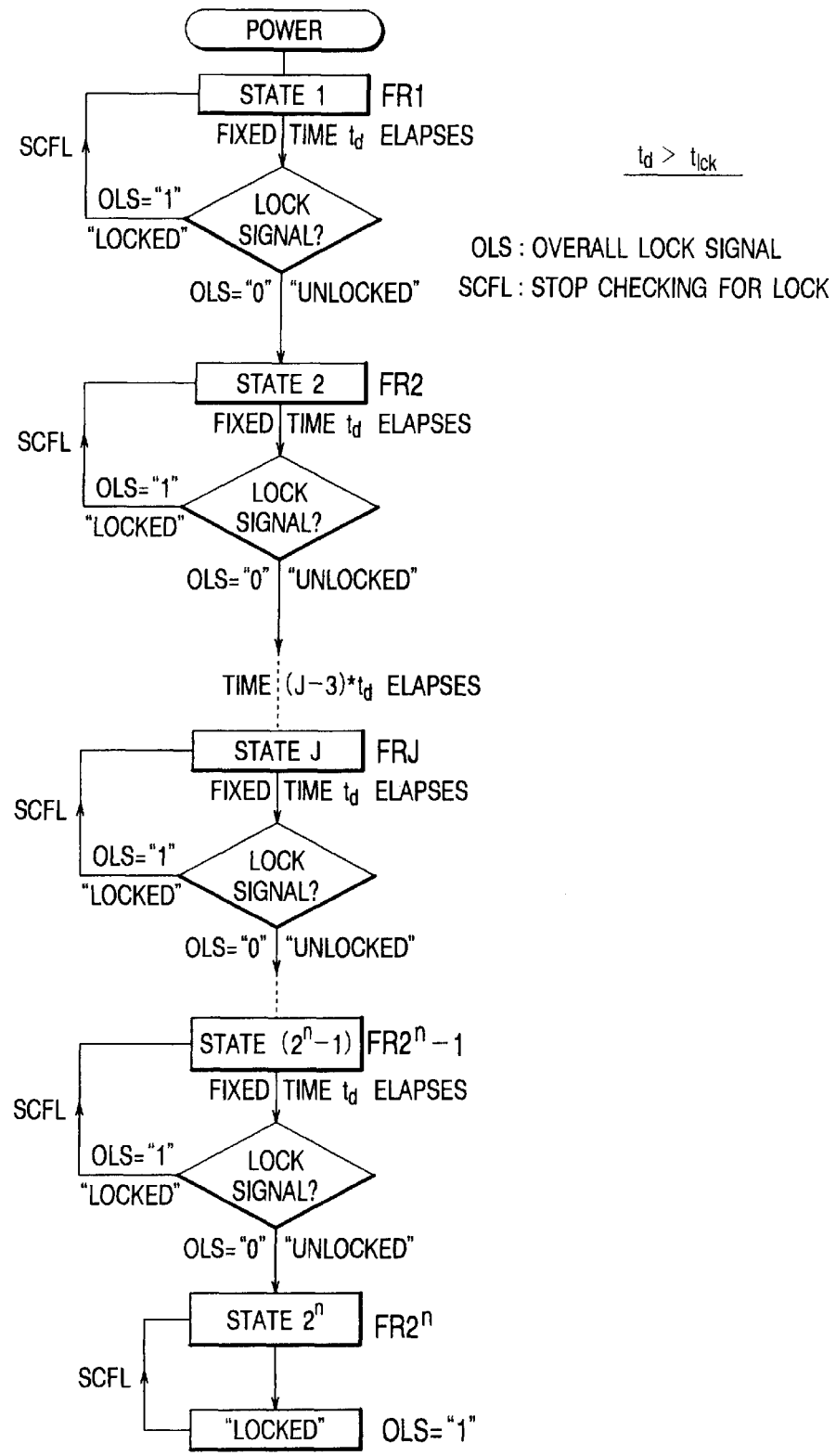
FIG. 5 shows a flow chart for describing an algorithm on which the present invention is based.

The basic operation of the auto-lock circuit is as follows. The output of an n-bit counter 250 is initially set to a particular state (e.g. state 1 in FIG. 5). This unique counter state defines a unique current range in the bias generator 142 and hence a unique frequency range (say FR1) for the current controlled oscillator 144. Each state of the n-bit counter 250 defines a unique frequency range for the VCO 140. After a fixed amount of time td>tlck elapses, the value of an overall lock signal (OLS) is checked. If OLS="1", the output of the counter and therefore the frequency range of Fvco remains the same (in this case FR1). The auto-lock circuit then stops checking for lock (SCFL). If however OLS="0" at the end of this time, the output of the n-bit counter 250 is changed to a new state (for example state 2) which commands a bias switch 260 to set a new current range in the bias generator 142 and hence a new frequency range (say FR2) for the current controlled oscillator 144. This process is repeated until the "locked" state is eventually achieved. The lock is guaranteed to occur within one of the possible 2 to the power of n states. After the lock is achieved (i.e. OLS="1"), the auto-lock circuit stops checking for the lock (SCFL). The lock is maintained by means of "normal PLL operation" which adjusts the bias voltage of the signal VCNT for temperature and supply voltage variations. Each of the component blocks in the auto-lock circuit will now be described in detail.

A lock detector 160 compares the phase difference between the frequency Fref and the divided frequency Fvco/N to a threshold phase value defined by the high frequency signal HFS. If the phase difference between Fref and Fvco/N is greater than the threshold phase value, an output (FLS) of the lock detector 160 is "0". Otherwise, FLS="1". The threshold phase value is determined by the maximum error tolerance of the PLL and the division ratio N of the programmable frequency divider 150. For example, let's assume that the PLL circuit has a jitter specification of 50 psec at Fvco=625 MHz and that N=8. In this case, Tref=12.8 nsec and Tvco*N=12.4 nsec. Therefore, $\Delta T=0.4$ nsec. This represents a minimum allowable threshold value ($\Delta T_{min}$). The actual threshold value may be larger than this minimum allowable threshold value. Whatever the actual threshold value, it will be small. Consequently, the high frequency signal (HFS) is required to define the threshold phase value. Since the resolution of the output signal of the lock detector 160 is high, it is referred to as a fine lock signal (FLS).

In one embodiment of this present invention, a rising edge and a falling edge of the high frequency signal HFS were used to define the threshold phase value. With Fvco=625 MHz as in the example above, the threshold phase value turned out to be $\Delta T=0.8$ nsec. Therefore, in this case, the PLL is considered to be in the "locked" state when $\Delta T<0.8$ nsec and will output the signal FLS="1". In comparison, when $\Delta T>0.8$ nsec, the PLL is considered to be the "unlocked" state and will output the signal FLS="0".

As the threshold phase value depends on the value of N, the frequency of the high frequency signal HFS needs to change depending on the value N. Hence a selector 270 requires several input signals, namely Fvco, Fvco/N1, . . . and Fvco/Nq. Excluding Fvco, all these input signals are taken from nodes within the programmable frequency divider 150. The input signals from a top to a bottom of the selector 270 represent signals with frequencies in descending order i.e. Fvco>Fvco/N1>Fvco/Nq. The value of Nq will be very close to (even for large Nmax) for the simple reason that the output of the selector 270 must be a high frequency signal.

A timer circuit 170 accepts the reference frequency signal having the reference frequency Fref and generates several output clock signals, namely TMO1, TMO2, . . . , TMOP, each with different cycle times. The signal TMO1 has the shortest cycle time while the signal TMOP has the longest cycle time. The signal TMOP has a cycle time (tcyc) longer than the required lock-up time of the PLL 100. This clock signal activates a strobe circuit 180 and commands it to begin strobing the output signal (FLS) of the lock detector 160. Therefore, the signal TMOP defines the first strobe point. Since the output of the strobe circuit 180 can only change about every time tcyc ($\mu$ sec to nsec order), it is referred to as a coarse lock signal (CLS).

The reason why more than one strobe point is required to define the coarse lock signal CLS is to prevent the PLL 100 from "locking" in a frequency range where in fact it cannot achieve the "locked" state.

For argument sake, assume that:
(a) the PLL 100 is required to lock at 625 MHz with jitter <50 psec and that
(b) the VCO 140 is operating at the very edge (right-hand) of a frequency range at Fvco=555.5 MHz. Therefore, the frequency Fvco is fixed over time.
(c) the signal FLS is only strobed at one point defined by the signal TMOP
(d) N=4.

Figure 6:
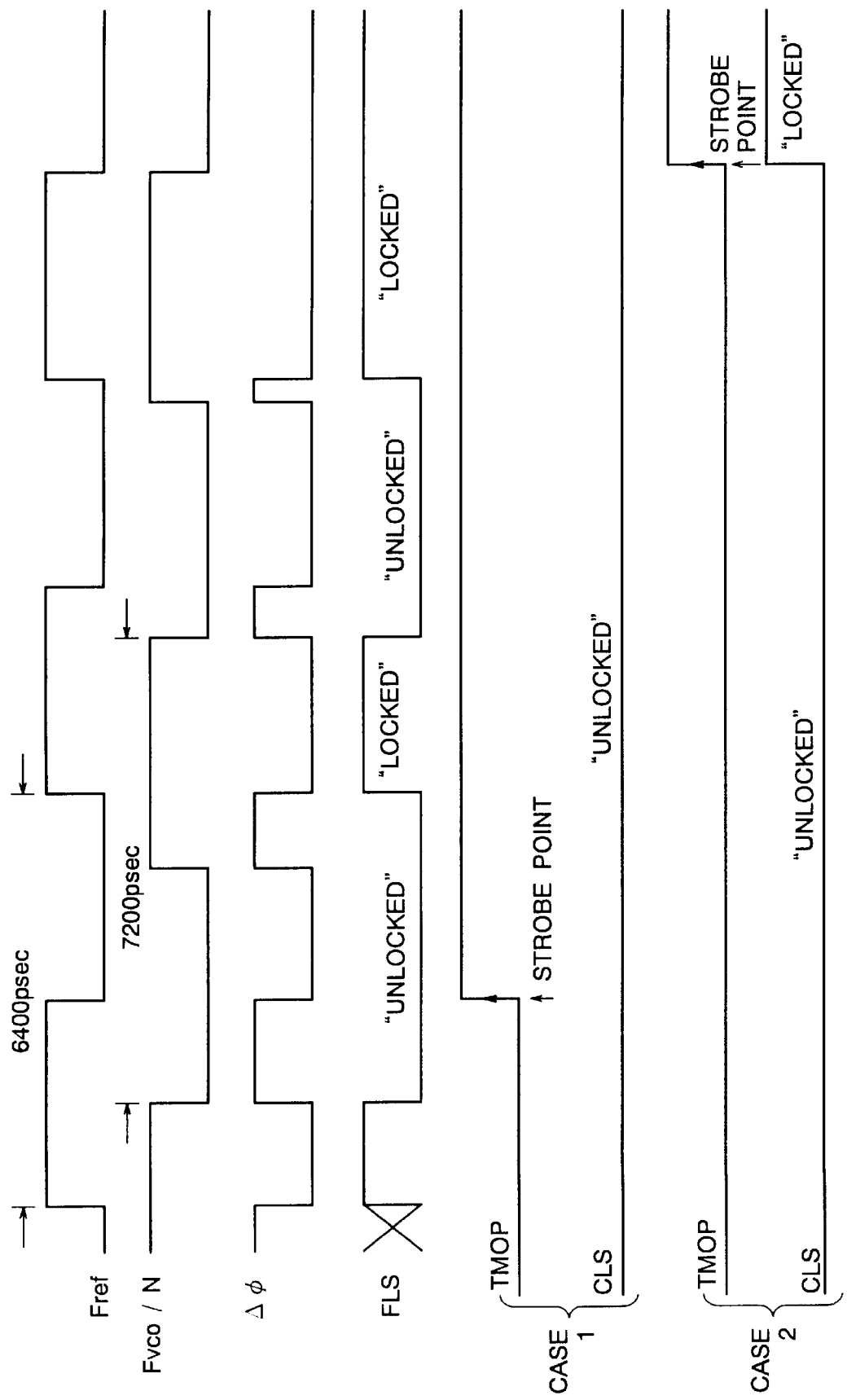
FIG. 6 shows waveforms for describing an algorithm in state-diagram form.

A study of cases 1 and 2 in FIG. 6 demonstrates that a final value of the output signal CLS is determined purely by where the strobe point occurs. Consequently, there is a possibility that the auto-lock circuit may return an erroneous result CLS="1" even though the PLL is clearly not in the "locked" state. To prevent an error like this from occurring, the signal FLS must be strobed at least two points. In fact, two strobe points do not guarantee that the auto-lock circuit will never produce an erroneous result. The reason for this is that it is possible that CLS="1" just at the two strobe points. Therefore, it is recommended that more than two strobe points are used and that the time between the strobe points is different. Obviously, the larger the number of the strobe points, the bigger the strobe circuit 180 becomes. The optimum number of the strobe points depends on ΔT, maximum jitter allowed and the selected value of N.

The time between the first strobe point and the last strobe point is called the strobe time. The strobe time (ts) is determined by the following approach.

Let's make the following assumptions:
(i) the PLL 100 is required to lock at 625 MHz with jitter <50 psec,
(ii) there is no phase difference between the frequencies Fref and Fvco/N at the rising edge of the signal TMOP,
(iii) the frequency of Fvco/N is different to that of Fref by N times the max error tolerance of the PLL i.e. N times the jitter specification,
(iv) jitter specification=50 psec, ΔT=0.8 nsec, N=4.

Figure 7:
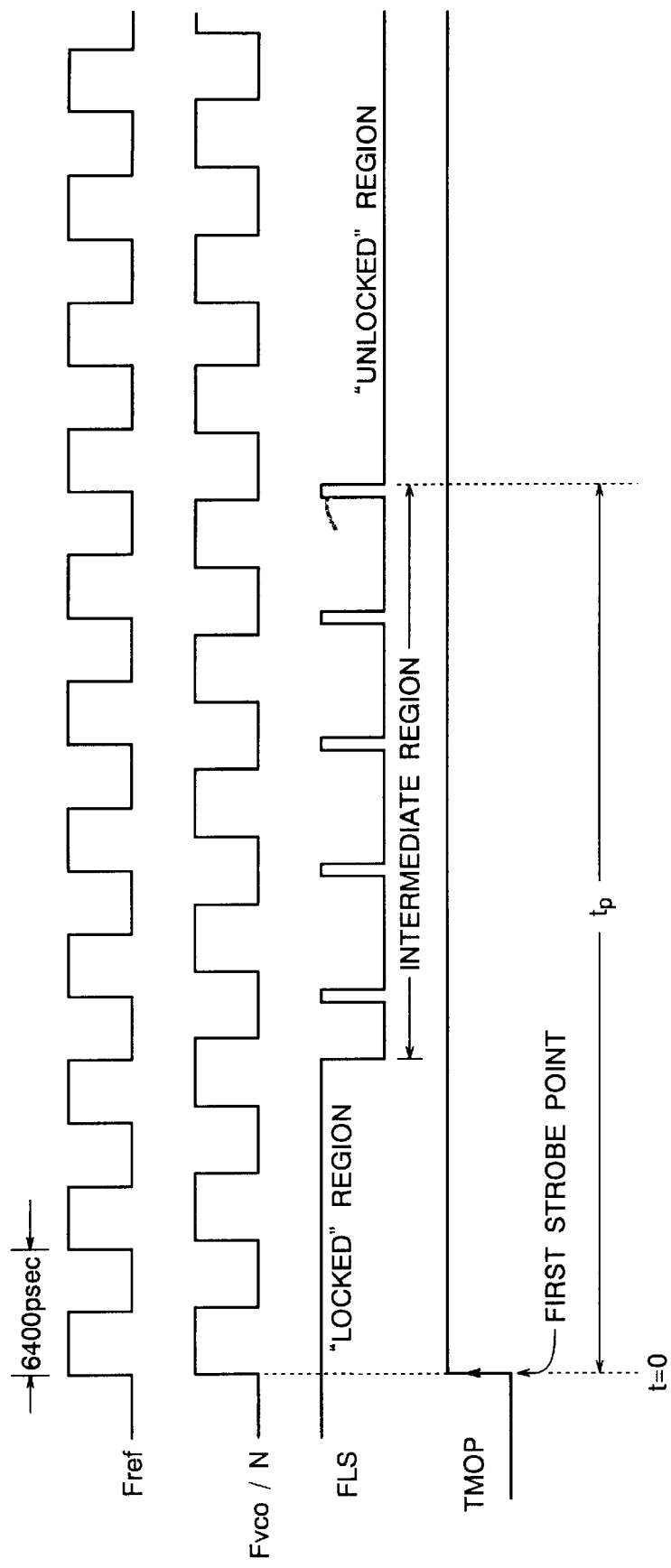
FIG. 7 shows waveforms for demonstrating that only one strobe point is not enough to define signal CLS and may indeed cause false lock to occur.

The signal FLS shown in FIG. 7 has three distinct regions,
(a) a "locked" region: where the PLL is clearly in the "locked" state,
(b) an intermediate region: where the PLL is "confuse" as to whether it is "locked" or it is "unlocked",
(c) an "unlocked" region: where the PLL is clearly "unlocked".

A time duration tp in FIG. 7 is defined as the time from t=0 to the time at which the "unlocked" region clearly begins. Note that the time duration tp only represents the time duration in the positive direction. Therefore, minimum strobe time duration ts(min)>2*tp.

The output signals TMO1, TMO2, ..., TMOP are used to define the strobe points within the time duration ts. The number of the strobe points does not necessarily have to equal the number of the output signals from the timer circuit 170.

If the value of the signal FLS="1" at every one of the strobe points, then the signal CLS="1". Otherwise CLS="0". CLS="1" indicates that the PLL can lock in the present frequency range at a fixed temperature T while CLS="0" indicates that it cannot. While CLS="1" indicates that the PLL can lock in the present operating range at a particular temperature T, whether it can maintain this lock over the entire operating temperature range depends on the value of VCOUT.

The VCOUT is the output signal of a voltage comparator 240. The voltage comparator 240 compares the voltage at its negative input terminal to the voltage at its positive input terminal. The voltage at its positive input terminal is a fixed reference voltage Vref and has an almost zero temperature coefficient. The voltage at the negative input terminal of the voltage comparator 240 can be connected to either GND or a variable voltage VCNT. An AND gate 190 receives the two signals VCOUT and CLS to produce an output signal OLS. The latter is level translated by using a level translator 220 to produce a signal OLS'. When OLS'="0", a CMOS complementary switch 200 is turned ON and the variable voltage VCNT is supplied to the negative input terminal of the voltage comparator 240. OLS'="1" turns the CMOS complementary switch 200 OFF and a CMOS complementary switch 210 ON thereby connecting the negative input terminal of the voltage comparator 240 to GND. If the voltage at its negative input terminal is less than the voltage at its positive input terminal, the output signal VCOUT="1". Otherwise VCOUT="0". If CLS="1" and VCOUT="1", then OLS="1". OLS="1" means that the PLL can maintain the lock in the present frequency range over the entire operating temperature range under the "normal PLL operation". Otherwise OLS="0". OLS="0" means that the PLL cannot maintain the lock in the present frequency range over the entire operating temperature range under the "normal PLL operation".

Once OLS="1", the "normal PLL operation" will maintain the lock over all temperature and power-supply voltage variations by adjusting the value of the variable voltage signal VCNT. Therefore, it is possible that VCNT<Vref at the lock at T=T1 but VCNT>Vref at T=T2. To prevent the signal VCOUT changing from "1" to "0" after the lock has been achieved and hence changing the frequency range in which the VCO 140 operates, the voltage applied to the negative input terminal of the voltage comparator 240 is switched from VCNT to GND once OLS="1". In fact, any voltage less than Vref is ok.

The strobe circuit 180 may be disabled after PLS="1" for the simple reason that there is no real need to check for the lock any more. The dotted line in FIG. 3 indicates that this is an option. In the preferred embodiment of this invention, the strobe circuit 180 is disabled. This can be achieved by setting the output signal of the timer circuit 170 (TMOP) to level "0". Hence, the strobe circuit 180 is never again reactivated and the signal CLS will remain at value "1".

Figure 8A:
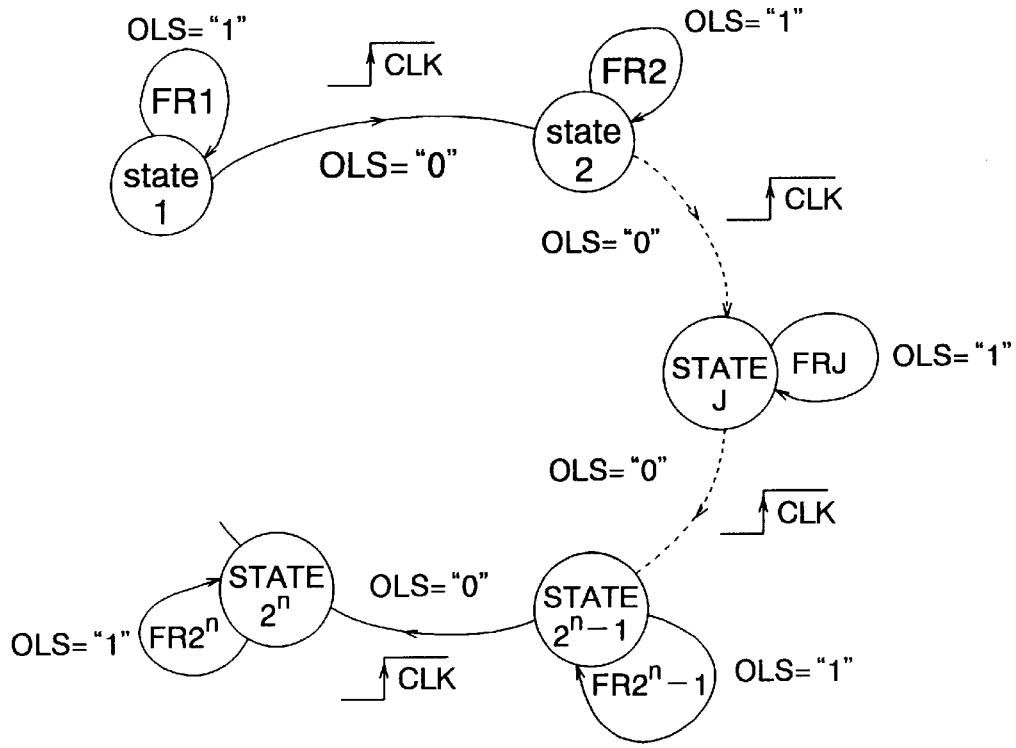
FIGS. 8A and 8B are illustrations for describing a technique for determining a minimum strobe time duration.
Figure 8B:
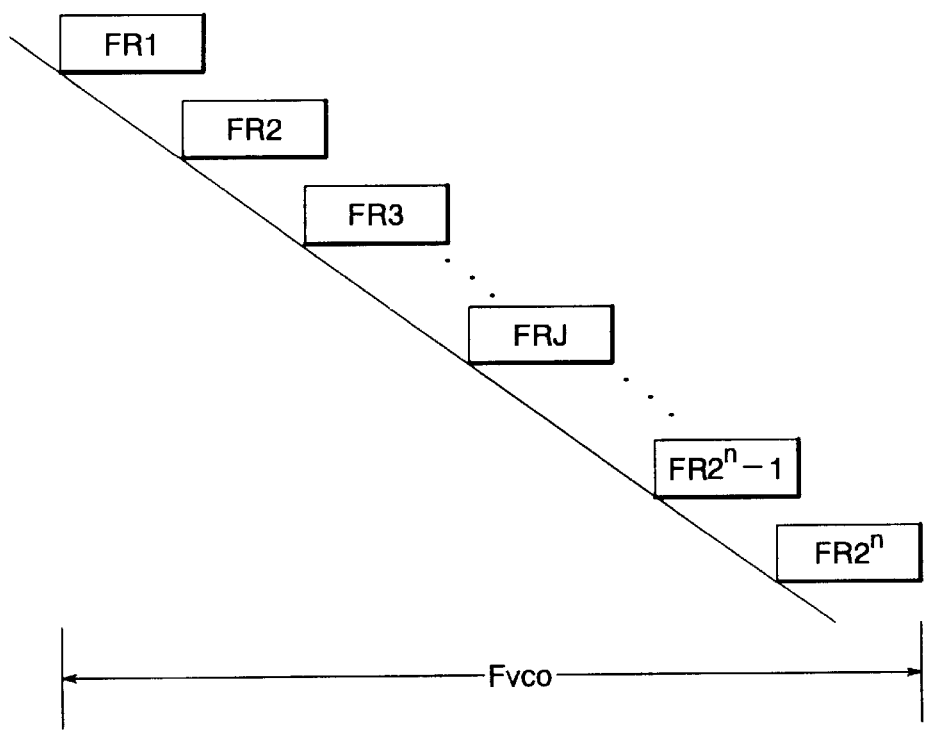

FIG. 8 shows a state diagram of the auto-lock circuit. In FIG. 8, the output state of the n-bit counter 250 is determined by the value of the signal OLS at the rising edge of an n-bit counter's clock signal CLK. Each state of the n-bit counter 250 defines a unique frequency range for the VCO 140. If OLS="1", the output of the n-bit counter 250 and therefore the frequency range of Fvco remains the same. If however OLS="0" at the rising edge of the clock signal CLK, the output of the n-bit counter 250 changes to a new state and hence the VCO 140 oscillates within a new frequency range. This process is repeated until the "locked" state is eventually achieved. The frequency ranges (FR1, FR2, ..., FR2n) must overlap to ensure that the PLL can achieve the lock over the required range irrespective of proves, temperature or power-supply voltage variations. For the n-bit counter 250, there are a possibility of 2 to the power of n states and hence 2 to the power of n frequency ranges. Consequently, the PLL 100 may take from time duration td (td=tcyc+t1+t2, t1<ts, t2=α) to (2 to the power of n)*td to achieve the "locked" state. The order in which the switches in the bias generator are activated is very important.

What is claimed is:

1. An auto-lock circuit which guarantees that a phase-locked loop (PLL) circuit locks with low jitter irrespective of process variations and maintains the lock over a wide operating temperature range, the auto-lock circuit comprising:

a voltage generator which produces a reference voltage having an almost zero temperature coefficient;

a voltage comparator which compares an output voltage of one of two switches to the reference voltage, the two switches being for selecting one of an input d.c. voltage and a ground voltage;

a selector which selects a high frequency signal used to determine a threshold phase value by the use of an output of a voltage controlled oscillator (VCO) and outputs of internal nodes within a programmable frequency divider, the high frequency signal being selected depending on a division ratio of the programmable frequency divider;

a lock detector which detects a phase difference between a reference frequency signal and a divided output frequency signal of the VCO from the programmable frequency divider, when the phase difference is less than the threshold phase value, the output of the lock detector indicating that the PLL is locked, when the phase difference is greater than the threshold phase value, the output of the lock detector indicating that the PLL is unlocked;

a timer circuit which produces multiple output clock signals defining strobe points in response to the reference frequency signal, one of these output clock signals having a cycle time longer than a required lock-up time of the PLL;

a strobe circuit which strobes the output of the lock detector by using the output clock signals from the timer circuit and the reference frequency signal, the output of the strobe circuit indicating whether or not lock can be achieved in the present frequency range at the present ambient temperature;

an AND gate which carries out a logical AND operation of the output of the voltage comparator and the output of the strobe circuit, the output value of the AND gate indicating whether or not the PLL achieves the lock and whether or not it maintains the lock over the entire operating temperature range under a normal PLL operation;

a level translator which translates the output level of the AND gate to a level for controlling which of the two switches is ON at any one time;

an n-bit counter which is supplied with the output of the AND gate as an input control signal and which can have up to $2^n$ unique output states, each unique state defining a unique current range in a bias generator included in the VCO and hence defining a unique frequency range in the VCO, the value of each unique state being controlled by the value of the input control signal, the input control signal denoting whether or not the PLL maintains the "locked" state over the entire operating temperature range, a clock signal of the n-bit counter coming from another output of the strobe circuit; and a bias switch which controls the current following in the bias generator of the VCO in response to the output of the n-bit counter.

2. An auto-lock circuit as claimed in claim 1 wherein said timer circuit includes:

means for disabling the strobe circuit after lock has been achieved, the strobe circuit being never reactivated again.

3. An auto-lock circuit as claimed in claim 1 wherein said auto-lock circuit stops checking for the lock after the lock is achieved, and the lock is maintained by using a phase detector (110) used in said normal PLL operation.

4. A phase-locked loop (PLL) circuit comprising:

a voltage controlled oscillator (VCO) which receives an input signal and outputs a signal (FVCO) having a frequency (Fout) that is a function of the voltage of said input signal, said VCO including a bias generator and a current controlled oscillator;

a frequency divider circuit which receives said FVCO signal, divides the frequency of said FVCO signal, and outputs a divided frequency signal FVCO/N;

a phase detector which detects a phase difference between the phase of a reference frequency signal and the phase of said divided frequency signal FVCO/N, said phase detector causing an input node of said VCO to be charged and discharged as a function of said detected phase difference, thereby altering said Fout frequency of said FVCO signal;

lock detector circuitry which detects a phase difference between said reference frequency signal and said FVCO/N signal and outputs a LOCKED signal when the phase difference is less than a threshold phase value and an UNLOCKED signal when the phase difference is greater than the threshold phase value; and monitoring circuitry which monitors the output of said lock detector circuitry at multiple instances and outputs a signal indicating whether or not lock can be achieved in the present frequency range at the present ambient temperature.

5. A phase-locked loop (PLL) circuit according to claim 4, further comprising:

comparing circuitry including a comparator, said circuitry receiving the output of said monitoring circuitry and a reference voltage, and outputting a signal indicating whether or not lock can be achieved and maintained over a normal operating temperature range.

6. A phase-locked loop (PLL) circuit according to claim 5, further comprising:

selection circuitry which receives the output of said comparing circuitry, and based upon said output of said comparing circuitry, adjusts a current that is to be input into said VCO.

7. A phase-locked loop (PLL) circuit comprising:

a voltage controlled oscillator (VCO) which receives a first input signal and outputs a signal (FVCO) having a frequency (Fout) that is a function of the voltage of said first input signal; and an auto-lock circuit coupled to said VCO, said auto-lock circuit operable to determine whether said PLL is locked and whether said PLL can remain locked over a specified temperature range under a normal PLL operation, said auto-lock circuit operable to control a second input to said VCO based on said determination of whether said PLL is locked and whether said PLL can remain locked over a specified temperature range.

* * * * *